(12) United States Patent
Boianceanu et al.

(10) Patent No.: US 10,411,693 B2
(45) Date of Patent: Sep. 10, 2019

(54) METHODS AND CIRCUITS FOR IMPROVED RELIABILITY OF POWER DEVICES OPERATING UNDER REPETITIVE THERMAL STRESS

(71) Applicant: Infineon Technologies AG, Neubiberg (DE)

(72) Inventors: Cristian Mihai Boianceanu, Bucharest (RO); Dan-Ionut Simon, Bucharest (RO)

(73) Assignee: INFINEON TECHNOLOGIES AG, Neubiberg (DE)

(*) Notice: Subject to any disclaimer, the term of this patent is extended or adjusted under 35 U.S.C. 154(b) by 162 days.

(21) Appl. No.: 14/526,332

(22) Filed: Oct. 28, 2014

(65) Prior Publication Data
US 2016/0118976 A1    Apr. 28, 2016

(51) Int. Cl.
*H03K 17/14* (2006.01)
*H03K 17/687* (2006.01)

(52) U.S. Cl.
CPC ......... *H03K 17/145* (2013.01); *H03K 17/687* (2013.01)

(58) Field of Classification Search
CPC .. G06F 11/079; G06F 11/0793; G06F 3/0616; G06F 3/064; G06F 11/073; G06F 11/076
See application file for complete search history.

(56) References Cited

U.S. PATENT DOCUMENTS

| | | | | |
|---|---|---|---|---|
| 5,616,950 | A * | 4/1997 | Liu | H01L 23/4824 257/287 |
| 6,878,466 | B1 * | 4/2005 | Lange | B32B 18/00 428/212 |
| 8,077,418 | B1 * | 12/2011 | Hu | G11B 5/3136 29/603.07 |
| 2004/0252430 | A1 | 12/2004 | Oumaru et al. | |
| 2008/0150609 | A1 | 6/2008 | Durbaum | |
| 2011/0054282 | A1 * | 3/2011 | Nekoomaram | A61B 5/0002 600/347 |
| 2014/0108841 | A1 * | 4/2014 | Tomi | G06F 1/206 713/323 |

(Continued)

FOREIGN PATENT DOCUMENTS

JP    2007502569 A    2/2007

OTHER PUBLICATIONS

"Wear leveling," In Wikipedia. Retrieved May 13, 2015 from http://en.wikipedia.org/wiki/Wear_leveling.

*Primary Examiner* — Jaweed A Abbaszadeh
*Assistant Examiner* — Alyaa T Mazyad
(74) *Attorney, Agent, or Firm* — Slater Matsil, LLP

(57) ABSTRACT

Thermo-migration induced stress in power devices can be mitigated by deactivating a subset of power device components (e.g., transistors, etc.) when the power device experiences a high stress condition. Deactivating the subset of power device components serves to bifurcate the active area of the power switching device into smaller active regions, which advantageously changes the temperature gradients in the active area/regions. In some embodiments, a control circuit dynamically deactivates different subsets of power device components to shift the thermo-migration induced stress points to different portions of the active region over the lifetime of the power switching device.

37 Claims, 15 Drawing Sheets

(56) References Cited

U.S. PATENT DOCUMENTS

| | | | | |
|---|---|---|---|---|
| 2015/0004909 A1* | 1/2015 | Agrawal | ............... | H02M 7/217 |
| | | | | 455/41.1 |
| 2015/0009756 A1* | 1/2015 | D'Alessandro | ........ | G11C 16/26 |
| | | | | 365/185.17 |
| 2015/0137890 A1* | 5/2015 | Nobbe | .................. | H03F 1/0277 |
| | | | | 330/295 |

* cited by examiner

METHODS AND CIRCUITS FOR IMPROVED RELIABILITY OF POWER DEVICES OPERATING UNDER REPETITIVE THERMAL STRESS

TECHNICAL FIELD

The present invention relates generally to power devices, and in particular embodiments, to techniques and mechanisms for methods and circuits for improved reliability of power devices operating under repetitive thermal stress.

BACKGROUND

Power devices generally include semiconductor devices or integrated circuits that are used as switches or rectifiers in power electronics, e.g., a switch-mode power supply, etc. Power devices may typically operate in a "commutation mode" in which they are either in a conducting stage (e.g., switched-on) or non-conducting stage (e.g., switched-off). During the conducting stage, thermo-mechanical stress may cause metallization degradation/destruction in the active area of a power device, which may lead to failure over time, e.g., shorts, etc. More specifically, high power transient events, like inductive clamping, may generate high transient local temperatures and high temperature gradients, which may cause metal/thermo migration (thermal driven migration of the metals) in chip components (e.g., metal lines, etc.). Indeed, metal/thermo migration may exert non-uniform stresses during each high power cycle until the inter-metal dielectric cracks and/or the power device fails.

One solution for reducing thermo-migration induced stress in power devices is to reduce the peak temperature during the high power pulse events, which is generally achieved by increasing the size of the power device's active area. However, increasing the size of the power device may be undesirable for applications requiring relatively small and/or compact semiconductor packaging. Accordingly, alternative techniques for reducing thermo-migration induced stress in power devices are desired.

SUMMARY OF THE INVENTION

Technical advantages are generally achieved, by embodiments of this disclosure which describe methods and circuits for improved reliability of power devices operating under repetitive thermal stress.

In accordance with an embodiment, a method for regulating a power device is provided. In this example, the method includes sensing when a power switching device is experiencing a high stress condition. The power switching device comprises an input port, an output port, and power device components coupled between the input port and the output port. An electrical current flows between the input port and the output port when the power switching device experiences the high stress condition. The method further includes activating a first subset of the power device components without activating a second subset of the power device components in response to the power switching device experiencing the high stress condition. The electrical current flows through the first subset of power device components without flowing through the second subset of power device components when the power switching device experiences the high stress condition.

In accordance with another embodiment, another method for regulating a power device is provided. In this example, the method includes sensing when a power switching device is experiencing a high stress condition. The power switching device comprises an input port, an output port, and power device components coupled between the input port and the output port. An electrical current flows between the input port and the output port when the power switching device experiences the high stress condition. The method further includes dynamically deactivating different subsets of the power device components during different periods. At least some of the power device components remain activated during each of the periods. The electrical current flows through activated power device components without flowing through the subset of power device components that are deactivated during a given period when the power switching device experiences the high stress condition.

In accordance with yet another embodiment, a power switching device is provided. In this example, the power switching device comprises an input port adapted to be coupled to a load, an output port adapted to be coupled to a sink, and a plurality of power device components coupled between the input port and the output port. Electrical current flows between the input port and the output port when the power switching device experiences a high stress condition. A first subset of the power device components are deactivated when the power switching device experiences a high stress condition during a first period, and a second subset of the power device components remain activated when the power switching device experiences the high stress condition during the first period. The electrical current flows through the second subset of power device components without flowing through the first subset of power device components when the power switching device experiences the high stress condition during the first period.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Aspects of this disclosure reduce thermo-migration induced stress in power devices by deactivating a subset of power device components (e.g., transistors, etc.) when the power device experiences a high stress condition. Deactivating the subset of power device components serves to bifurcate the active area of the power switching device into smaller active regions, which advantageously changes the temperature gradients in the active area/regions, e.g., the axis running parallel to the current flow in some implementations. In some embodiments, a control circuit dynamically deactivates different subsets of power device components to shift the thermo-migration induced stress points to different portions of the active region over the lifetime of the power switching device. Various techniques can be used to select which subsets of power device components are deactivated during a given period of operation. For example, subsets of power device components can be selected randomly or according to a predefined pattern, e.g., a pattern developed during simulation and/or testing to extend the average lifetime of a power switching architecture. Alternatively, the subsets of power device components can be selected based on readings from stress sensors. The stress sensors may be any sensor whose readings can be used to determine/predict which portions of the active area have experienced stress, including temperature sensors and mechanical stress sensors. Notably, in some situations, manipulation of temperature gradients may extend the lifetime of a power device even when the peak temperature is increased. Similarly, deactivating a subset of power device components improve the overall life expectancy of a power device even though the temperature gradients are increased across some portions of the active area. Advantageously, deactivating subsets of power device components does not significantly affect the on-state resistance of the power device. These and other aspects are discussed in greater detail below.

Figure 1:
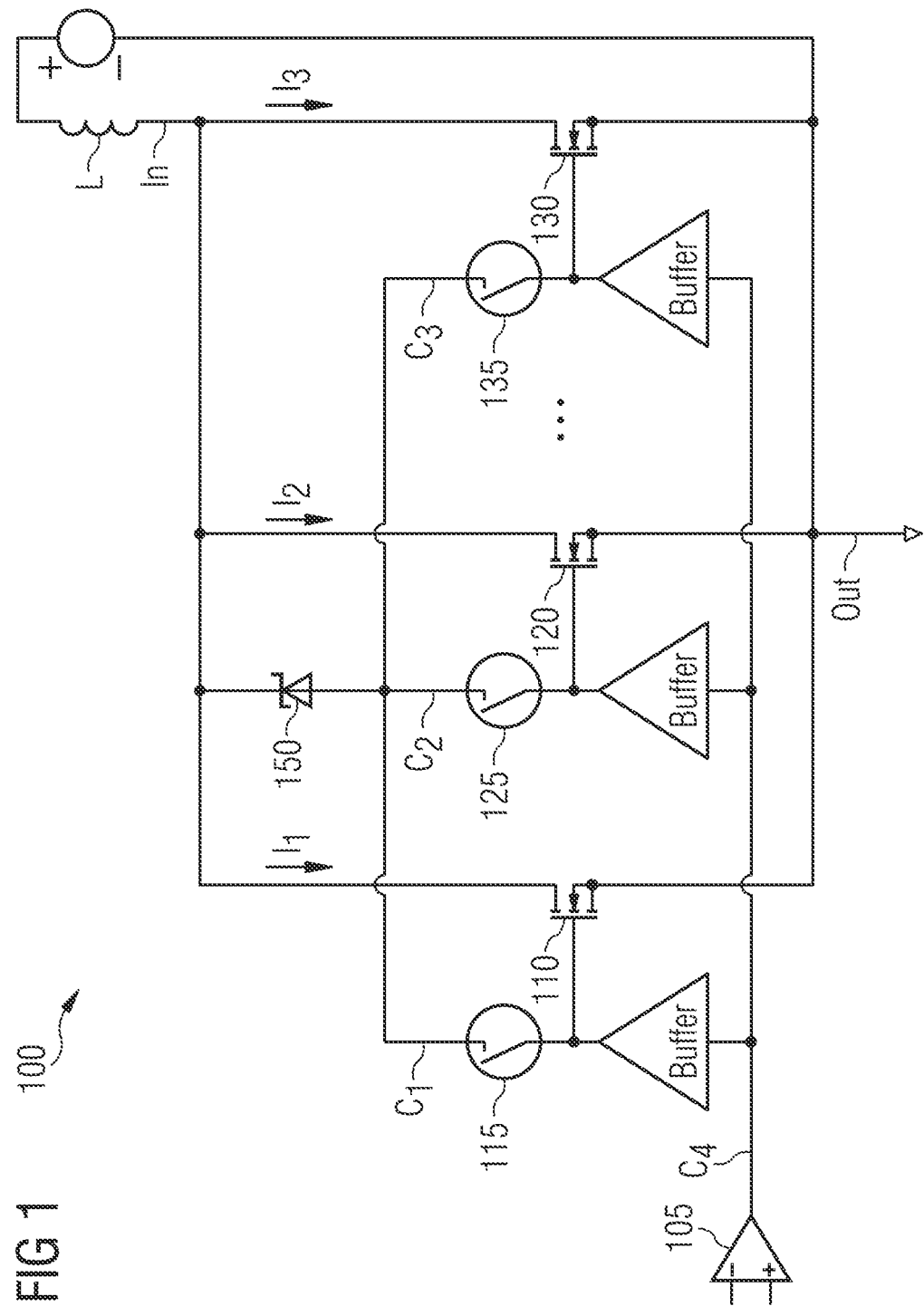
FIG. 1 illustrates a circuit diagram of an embodiment power switching device.

Aspects of this disclosure can be embodied in power switching devices coupled to inductive loads. FIG. 1 illustrates a circuit diagram of an embodiment power switching device 100 coupled to an inductive load (L). As shown, the power switching device 100 comprises a gate driver 105, a plurality of transistors 110, 120, 130, a plurality of switches 115, 125, and 135, and a Zener diode 150. Notably, the switches 115, 125, 135 are configured to selectively open connections that carry activation signals to gates of the transistors 110, 120, 130 during high stress periods, thereby preventing the activation signal from activating the transistors 110, 120, 130 during a high stress event. In this disclosure, the term "high stress period" is used synonymously with the terms "high stress cycle" and "high stress instance."

More specifically, the transistors 110, 120, 130 have a source-drain path coupled in-between the input (IN) and output (OUT) of the power switching device 100, as well as gates coupled to the Zener diode 150 via connections C1, C2, C3 and to the gate driver 105 via a connection (C4). When one or more of the transistors 110, 120, 130 are activated via an activation signal or a triggering signal, electrical current of the inductive load (L) flows between the input (IN) and output (OUT) ports of the power switching device 100.

Activation signals are communicated over the connections C1, C2, C3 when the Zener diode 150 enters an avalanche mode, as may occur when the inductive load (L) voltage exceeds a threshold (which is indicative of the power switching device 100 experiencing a high stress condition). Indeed, the Zener diode 150 becomes shorted upon entering the avalanche mode, which elicits the activation signal to flow through the Zener diode 150 and over the connections C1, C2, C3 to the gates of the transistors 110, 120, 130. One or more of the connections C1, C2, C3 may be opened (or broken) by the switches 115, 125, 135. The switches 115, 125, 135 may be any component or feature configured to break or open the connections C1, C2, C3 (respectively) in order to prevent activation signals from reaching gates of the corresponding transistors 110, 120, 130 when the power switching device 100 is experiencing a high stress condition. In an embodiment, a subset of the switches 115, 125, 135 are permanently opened during a manufacturing process of the power switching device 100. In another embodiment, different subsets of the switches 115, 125, 135 are dynamically opened during different cycles of operation to migrate the thermo-induced stress points to different portions of the active area over the lifetime of the power switching device 100.

In some embodiments, deactivation of one or more of the transistors 110, 120, 130 during high stress periods does not completely disable the deactivated transistor, as the deactivated transistor can nevertheless be actuated via a triggering signal. More specifically, a gate driver 105 is configured to actuate the power switching device 100 by communicating a triggering signal over the connection C4 to the gates of the transistors 110, 120, 130. As used herein, the term "activation signal" refers to a signal that is generated/elicited when a power device experiences a high stress condition, while the term "triggering signal" refers to a control signal that is generated to actuate the power device irrespective of whether the power device is experiencing a high stress condition. Markedly, the connections C1, C2, and C3 are separate and distinct from the connection C4, such that a triggering signal can be communicated over the connection C4 to the gates of the transistors 110, 120, 130 irrespective of whether one or more of the connections C1, C2, and C3 are open. For example, a triggering signal can be communicated over the connection C4 to the gate of the transistor 120 even when the connection C2 is open. The transistors 110, 120, 130 may be protected from overvoltage by the Zener diode 150. Other protection functionalities may also be implemented, e.g., short-circuit protection, over-temperature protection, etc. The transistors 110, 120, 130 may be cells or groups of cells which are part of the active area of the power device 100.

Figure 2:
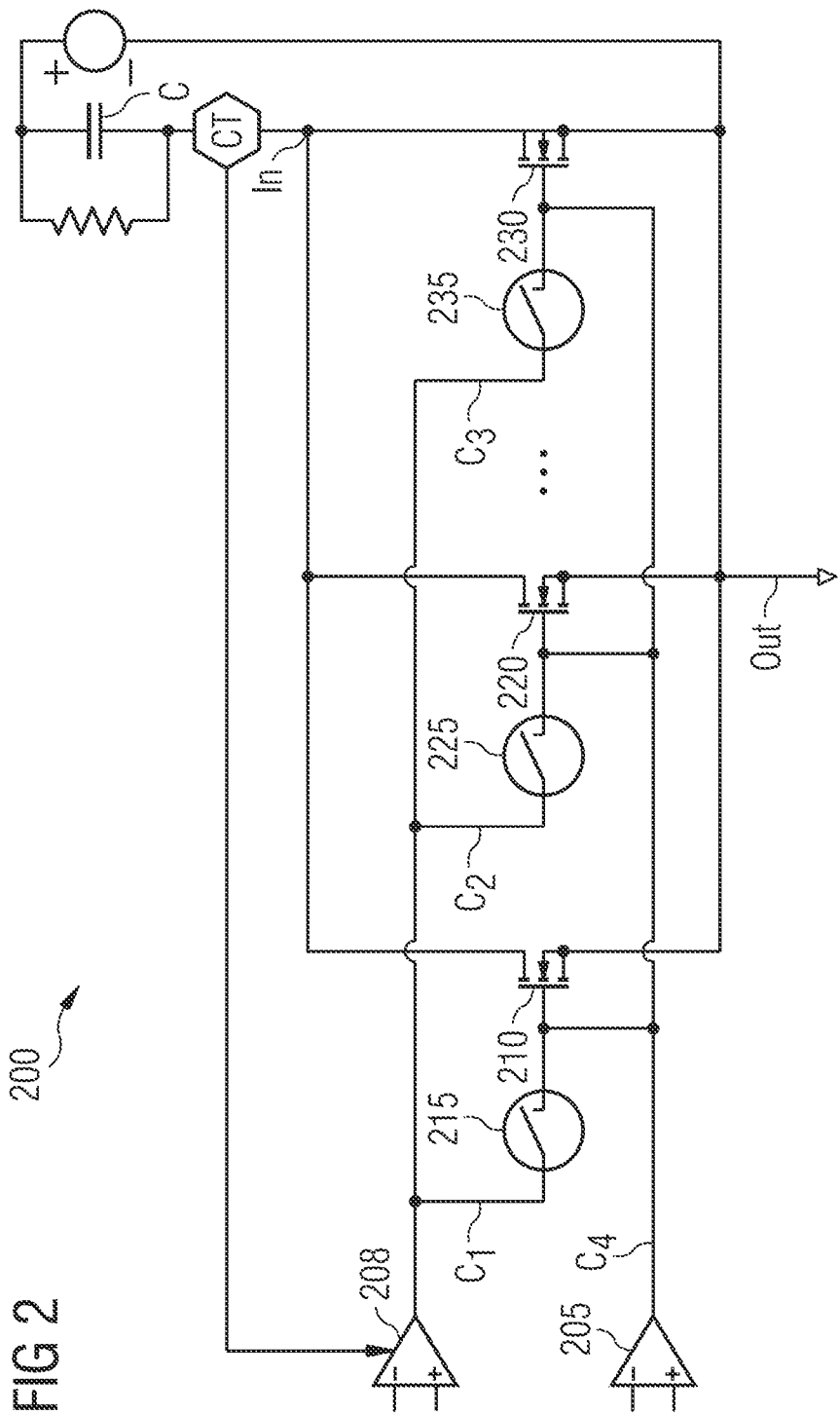
FIG. 2 illustrates a circuit diagram of another embodiment power switching device.

Aspects of this disclosure can also be embodied in a switching device coupled to a capacitive load. FIG. 2 illustrates a circuit diagram of an embodiment power switching device 200 coupled to a capacitive load (C). As shown, the power switching device 200 comprises gate drivers 205, 208, a plurality of transistors 210, 220, 230, a plurality of switches 215, 225, 235, and a current sensor (CT). The gate driver 205 and the transistors 210, 220, 230 may be configured similarly to corresponding components of the power switching device 100. For example, the gate driver 205 may provide a triggering signal to gates of the transistors 210, 220, 230 via the connection C4 to actuate the power switching device 200. Moreover, the transistors 210, 220, 230 may conduct current flowing from the input (IN) and output (OUT) ports of the power switching device 200 when a triggering or activation signal is received at their gates.

The current sensor 290 may be configured to detect when the power switching device 200 is experiencing a high load condition, as well as to notify the gate driver 208 when the high load condition is detected, which may prompt the gate drive 208 to provide an activation signal to the gates of the transistors 210, 220, 230 via the connections C1, C2, C3. The switches 215, 225, 235 may be configured similar to the switches 115, 125, 135 in the power switching device 100. For example, the switches 215, 225, 235 may be statically or dynamically configured to break/open the connections C1, C2, C3. While the power switching devices 100, 200 are depicted as comprising transistors, the architectures/techniques described herein can be applied to power devices that include any type of power device component, e.g., diodes, thyristors, etc, because the method increases the lifetime of the metallization system (which is part of the power device component). Accordingly, aspects of this disclosure that are discussed in the context of "transistors" are applicable to any type of power device component, unless otherwise specified. The lifetime of a power device or system may be determined largely by its weakest point, and aspects of this disclosure can shift the stress points away from the weak points (or points that have received the most stress up to that stage) to increase the lifetime.

Figure 3:
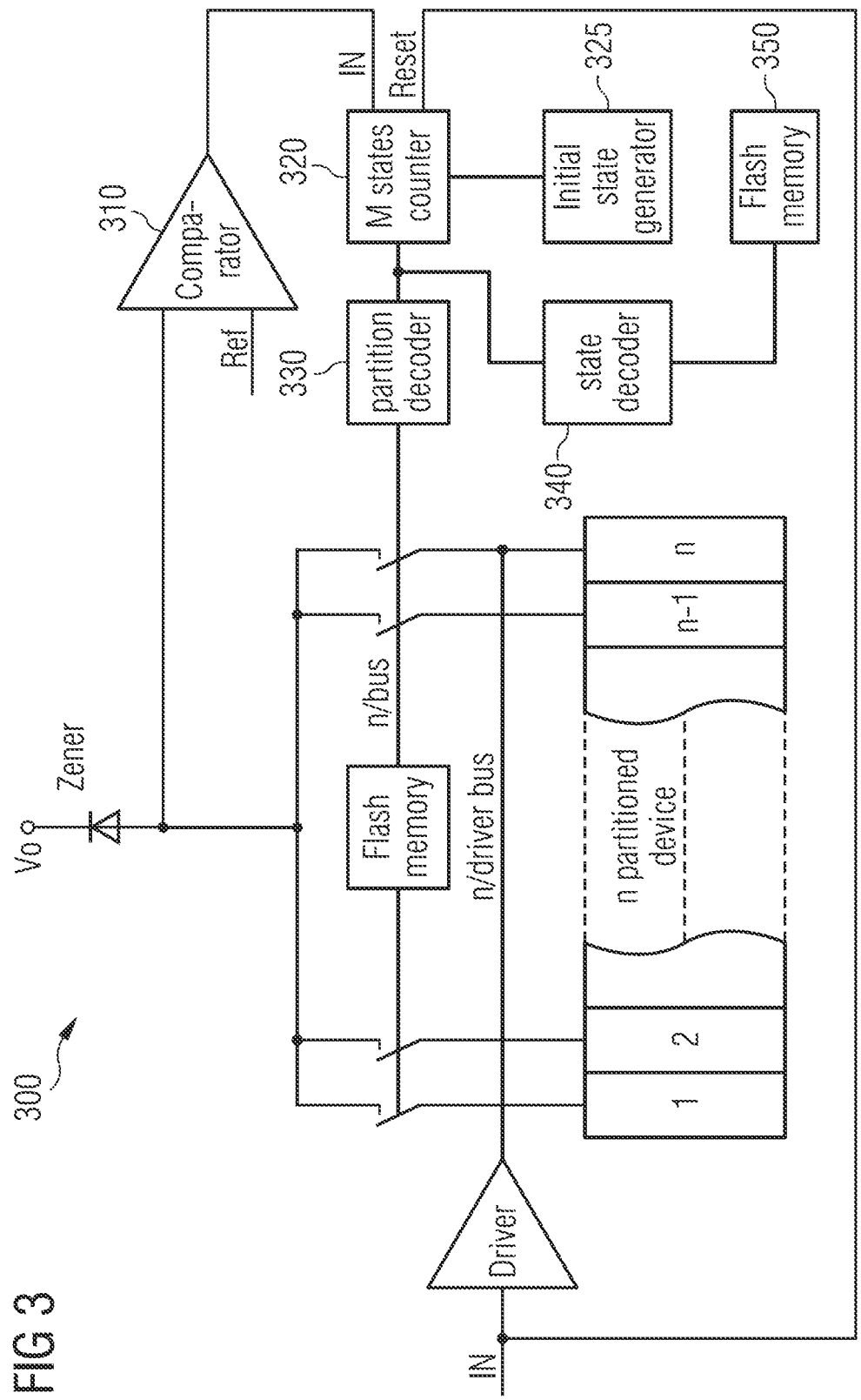
FIG. 3 illustrates a circuit diagram of an embodiment selection circuit for selecting different subsets of transistors to deactivate during different periods of power device operation.

In some embodiments, a control circuit dynamically deactivates different subsets of power device components to shift thermo-migration induced stress points to different portions of the active region over the lifetime of the power switching device. In one example, a new subset of power device components are deactivated after a predefined number of high stress instances. FIG. 3 illustrates an embodiment selection circuit 300 for selecting different subsets of transistors to deactivate during different periods of operation. As shown, the embodiment selection circuit 300 includes a comparator 310 that detects when the power switching device is experiencing a high stress condition, a counter 320 that tracks the number of instances in which the comparator 310 detects the high stress condition, and a partition decoder 330 that selects which subset of power device components are to be deactivated during the next operating period. In this example, the comparator 310 detects a voltage rise when the clamping circuit (e.g., the Zener chain) is triggered, and sends a count signal to the counter 320. After receiving a threshold number of count signals, the counter 320 prompts the partition decoder 330 to select a new subset of power device components to deactivate during the next operating period.

The selection circuit 300 further includes an initial state generator 325 that stores an initial state for the counter 320, as well as a state decoder 340 and flash memory 350 that record the number of clamping events that are triggered while the counter 320 is powered-on. The state decoder 340 and flash memory 350 may be excluded in some embodiments, in which case the counter 320 may prompt the partition decoder 330 to select a new subset of power device components to deactivate during each consecutive high stress period. The counter 320 can be powered off to reset the counter 320, which may cause the selection circuit 300 to revert back to an initial state during the next clamping event.

Figure 4:
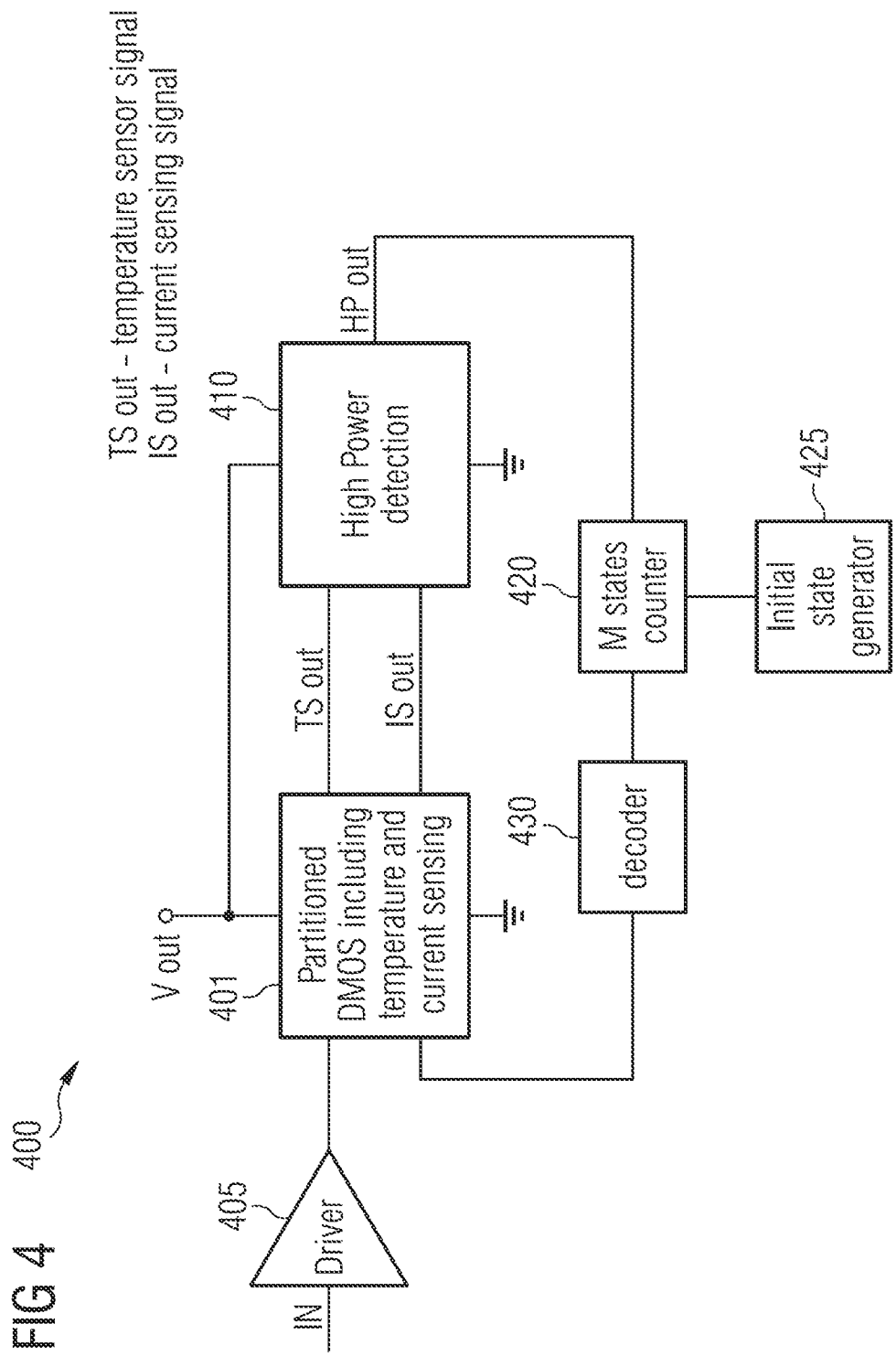
FIG. 4 illustrates a circuit diagram of another embodiment selection circuit that is configured to sense temperature, current, and voltage in the active area of a power device to identify high stress events.

In some embodiments, the high stress condition may be detected using temperature and/or current sensors in the active area of a power device. FIG. 4 illustrates an embodiment selection circuit 400 that is configured to sense temperature/current to determine high stress events of a power device. The power device comprises an active area 401 and a driver 405 configured to actuate/activate power device components in the active area 401. The power device components in the active area 401 may be partitioned into groups of one or more power device components. The groups may be monitored by various sensors, including temperature sensors and/or current sensors. As shown, the embodiment selection circuit 400 includes a high power detector 410 that detects instances of high stress in the power device, a counter 420 that tracks the number of high stress instances, an initial state generator 425 that stores an initial state for the counter 420, and a partition decoder 430 that selects subsets of power device components to be deactivated during the different operating periods. Notably, the high power detector 410 may detect high stress instances in a variety of ways. In one example, the high power detector 410 detects that a high stress instance has occurred when a temperature (or temperature differential) in the active area exceeds a threshold. In another example, the high power detector 410 detects that a high stress instance has occurred when a current flowing through the active area exceeds a threshold. In yet another example, the high power detector 410 detects that a high stress instance has occurred when a power level (e.g., ISout*Vout) in the active area exceeds a threshold.

Figure 5:
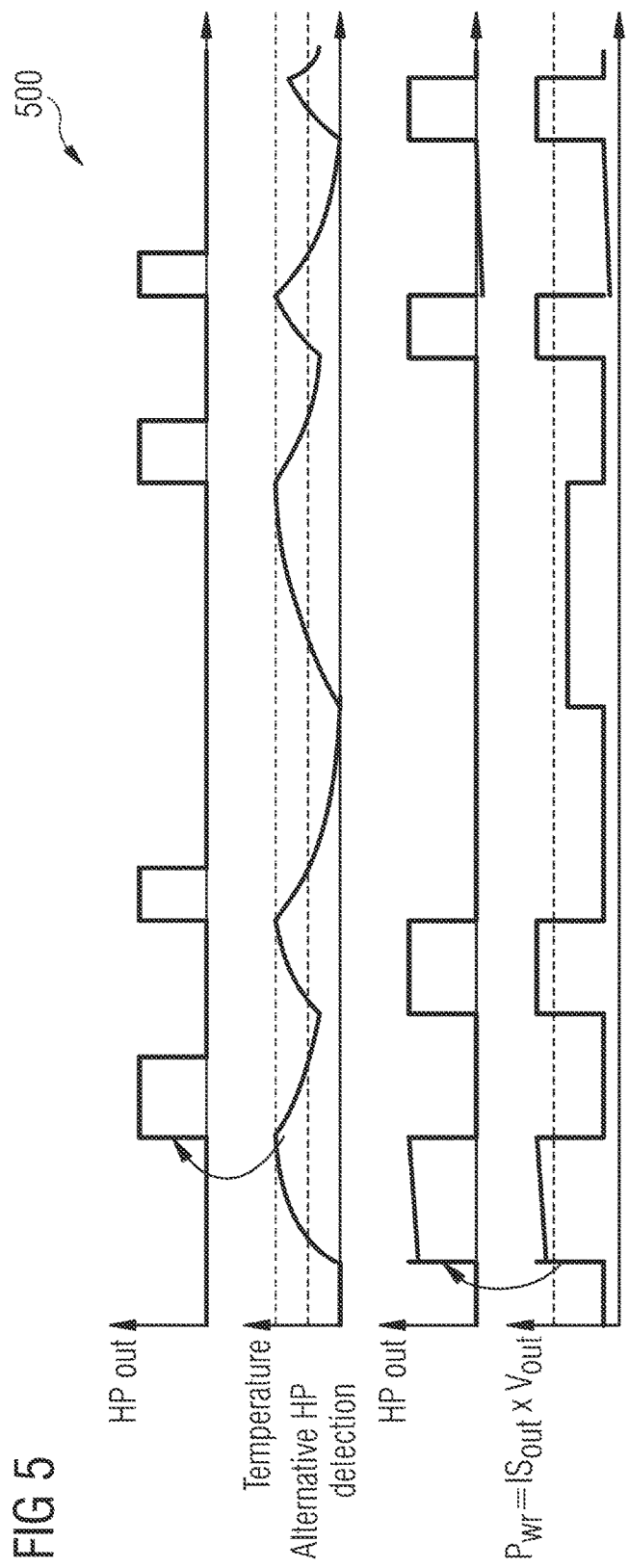
FIG. 5 illustrates a timing diagram for the embodiment selection circuit depicted in FIG. 4.

FIG. 5 illustrates a timing diagram 500 for the embodiment selection circuit 400, which shows different ways of detecting high stress conditions. In one example, the high power detector 410 provides a count signal (e.g., HP out) in response to an active area temperature exceeding an upper threshold. The high power detector 410 continues to provide the count signal until the active area temperature falls below a lower threshold. In another example, the high power detector 410 provides a count signal (e.g., HP out) in response to a power level in the active area exceeding a threshold. The power level may be determined using the current (e.g., $IS_{OUT}$) and voltage ($V_{OUT}$) readings taken from the active area. The high power detector 410 continues to provide the count signal until the power level falls below the threshold Various techniques can be used to select which subsets of power components to deactivate during a given operating period. In one embodiment, the subsets of power device components are selected randomly. In another embodiment, the subsets of power device components are selected based on a predefined pattern. The predefined pattern may have been shown to provide some desirable performance characteristic (e.g., extend the average lifetime while still maintaining certain performance levels) during simulation and/or testing.

Figure 6:
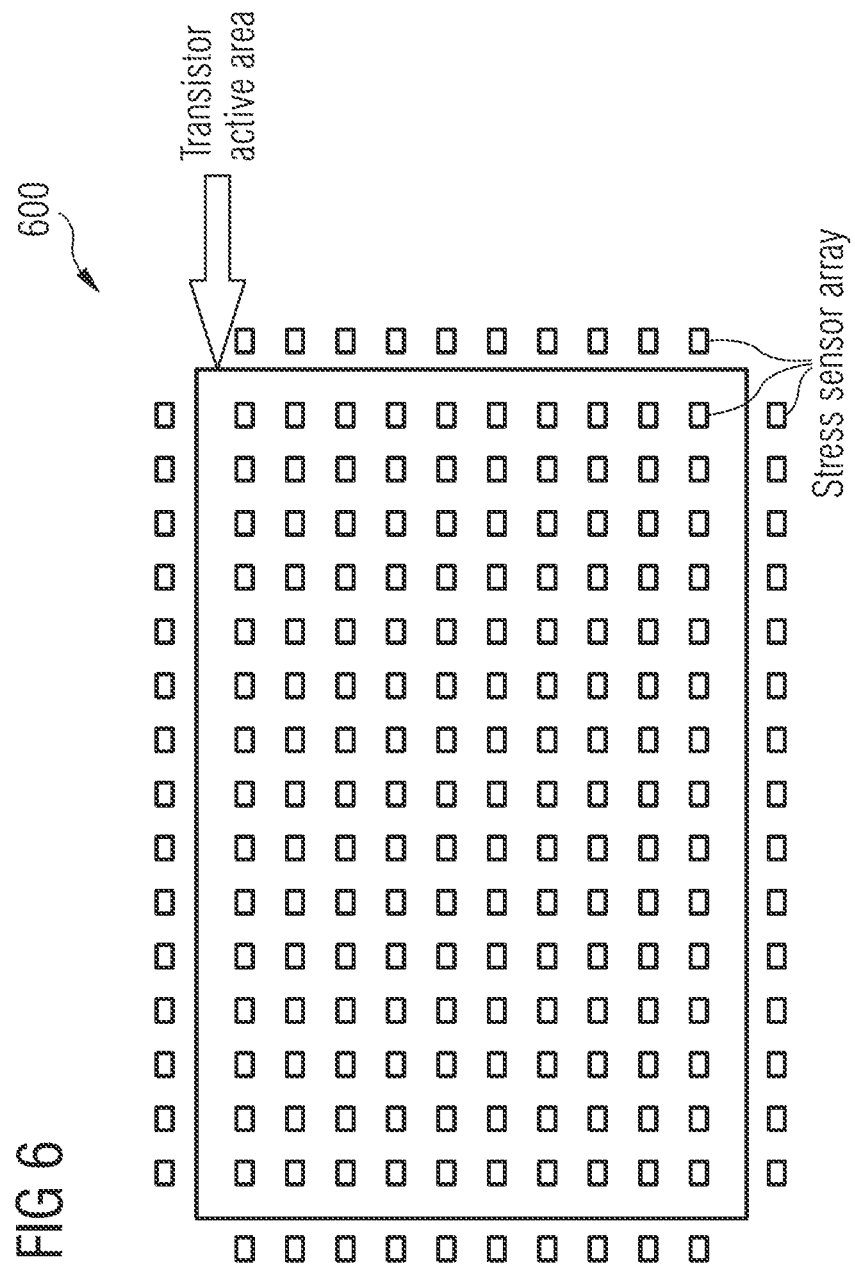
FIG. 6 illustrates a diagram of an embodiment sensor array for monitoring stress in the active area of a power device.

As yet another alternative, the subsets of power device components can be selected in accordance with readings from stress sensors, such as temperature sensors, mechanical stress sensors, and/or other sensors whose readings can be used to determine/predict which portions/components have experienced stress. This may allow the stress points to be shifted based on the actual (or projected) stress levels experienced by the device. FIG. 6 illustrates a sensor array 600 adapted to monitor the active area of a power device. As shown, different sensors in the sensor array 600 monitor different portions of the active regions. The sensor array 600 may include temperature sensors, mechanical stress sensors, or other sensors adapted to monitor stress. The sensor array 600 may provide real-time stress detection information for use in selecting subsets of transistors over the lifetime of a power switching device.

Figure 7:
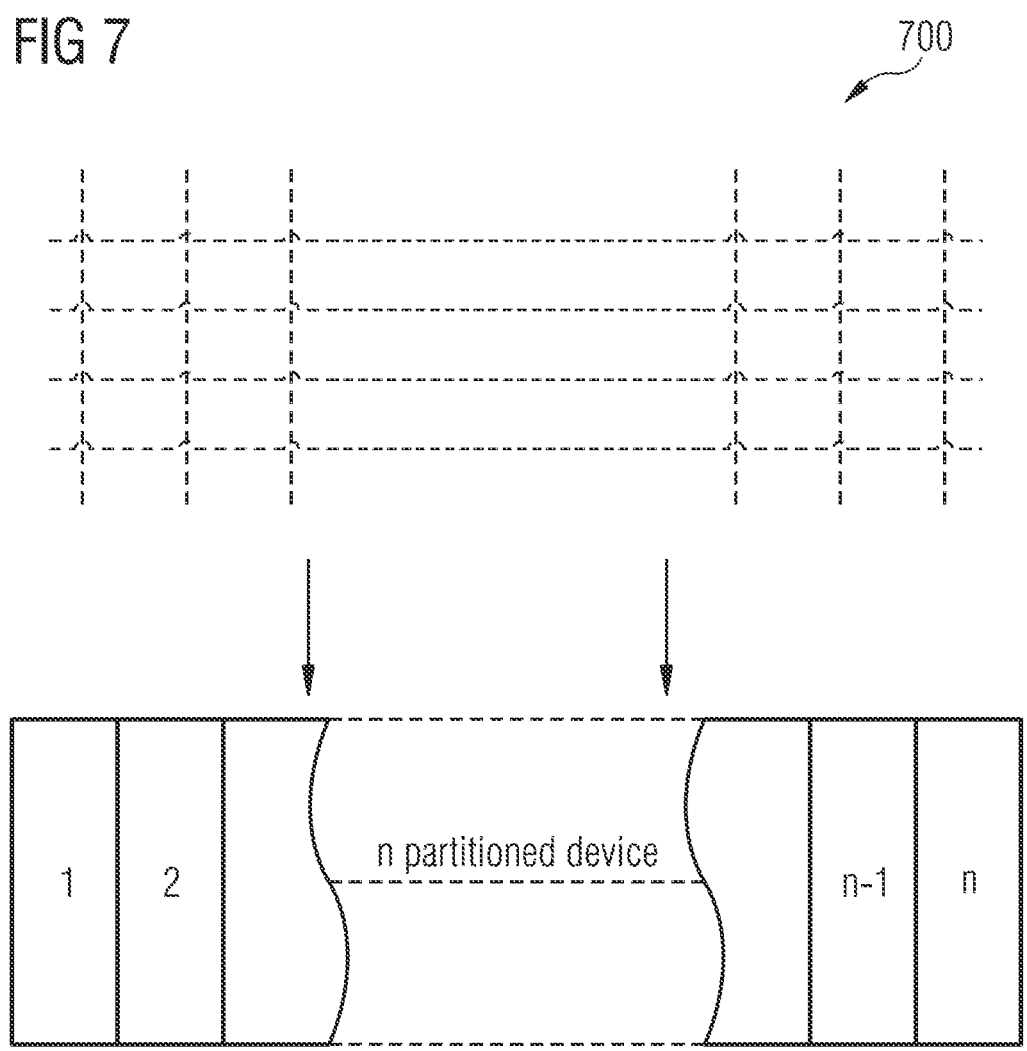
FIG. 7 illustrates a diagram of an embodiment metal line sensor array for monitoring stress in the active area of a power device.
Figure 8:
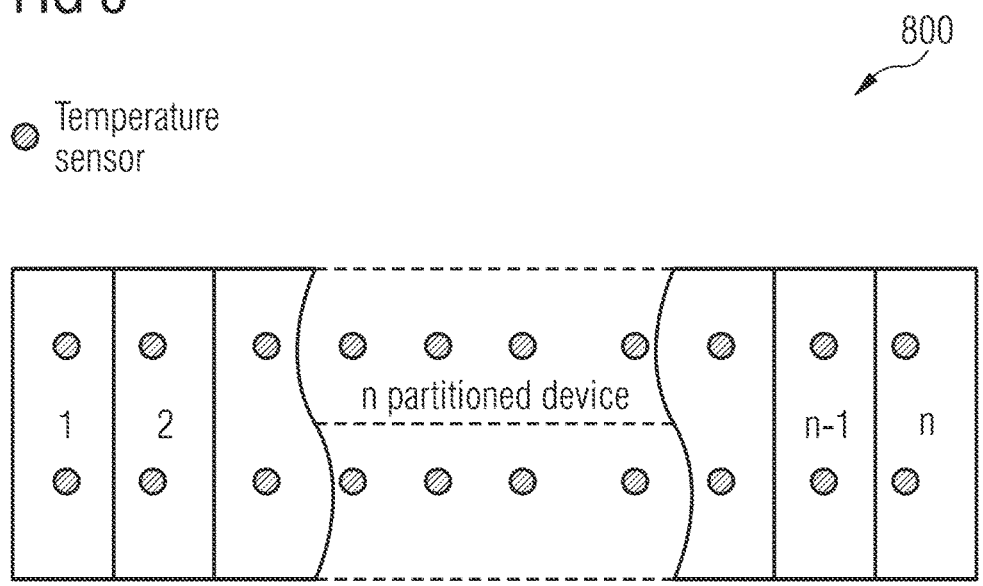
FIG. 8 illustrates a diagram of an embodiment temperature sensor array for monitoring stress in the active area of a power device.

One type of mechanical stress sensor is a metal line stress sensor. FIG. 7 illustrates a metal line stress sensor array 700 for monitoring stress in active area of a power device. The metal lines can be embedded in the metallization of power device components, and may be adapted to sense the stress distribution based on the variation in resistance of each metal line. In an embodiment, the metal line stress sensor array 700 measures stress indirectly by monitoring a resistance/voltage change due to mass migration and/or piezoelectric effects. The sensors in the metal stress sensor array 700 can be individual parts within the semiconductor-metal-dielectric system, or a combination of parts within the semiconductor-metal-dielectric system. Temperature sensors may also be used to monitor stress. FIG. 8 illustrates a temperature sensor array 800 for monitoring stress in active area of a power device. The temperature sensor array 800 may be adapted to create a temperature map of the active region, which may be used to establish a direct correlation between temperature distribution and mechanical stress.

Figure 9:
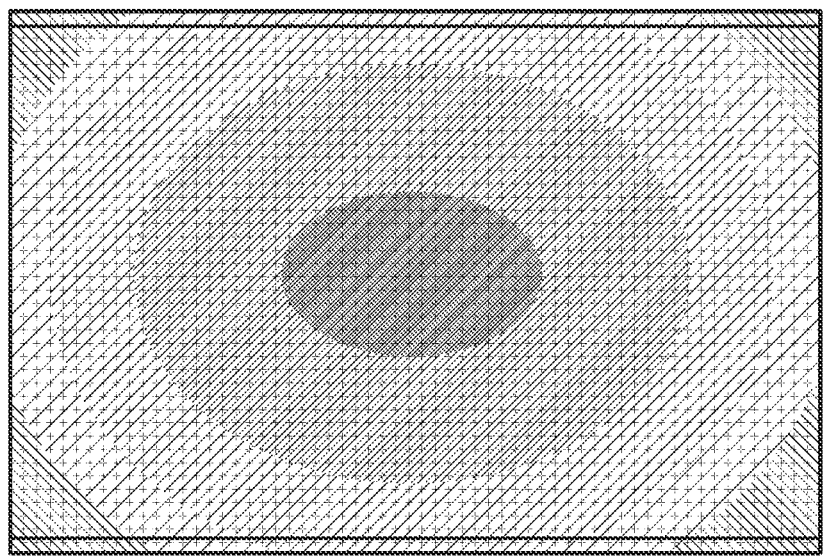
FIG. 9 illustrates a graph of a temperature distribution in an active area of a conventional power switching device during a high stress period.
Figure 10:
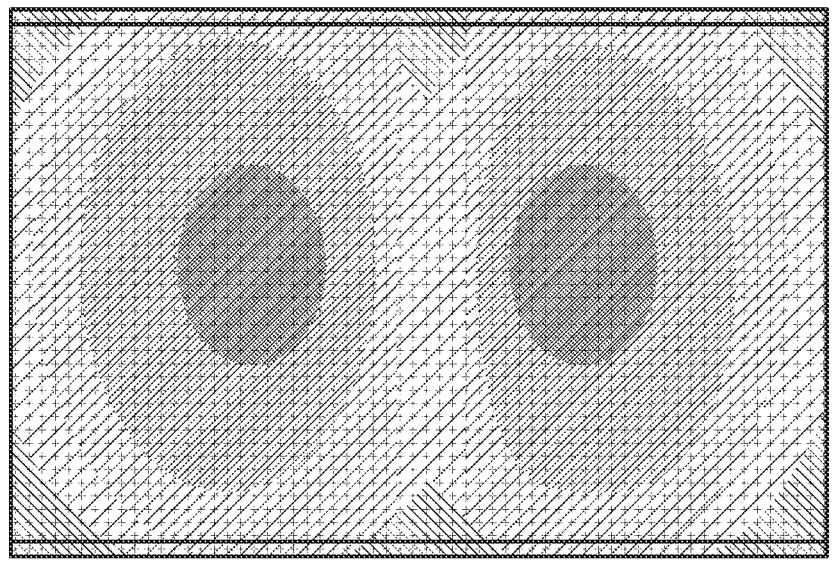
FIG. 10 illustrates a graph of a temperature distribution in an active area of an embodiment power switching device having a subset of transistors deactivated during a high stress period.

Aspects of this disclosure substantially increase the lifetime of power devices by reducing and redistributing thermo-mechanical stress. FIG. 9 illustrates a graph of a temperature distribution in an active area 900 of a conventional power switching device having all transistors activated. FIG. 10 illustrates a graph of a temperature distribution in an active area 1000 in an embodiment power switching device having a subset of transistors deactivated. As shown, the deactivated transistors are located in the center of the active area 1000, and serve to bifurcate the active area into two active regions positioned on opposite sides of the deactivated transistors. Notably, the two active regions have a reduced size, which advantageously changes the temperature gradient in the active regions. It should be appreciated that FIG. 10 illustrates merely one of many configurations in which deactivated transistors can bifurcate/subdivide an active area into two or more active regions to achieve changed temperature gradients. In other configurations, different subsets of transistors may be deactivated to subdivide the active area into different sub-regions, e.g., different numbers of sub-regions, non-uniform sub-regions having different widths, etc.

Figure 11:
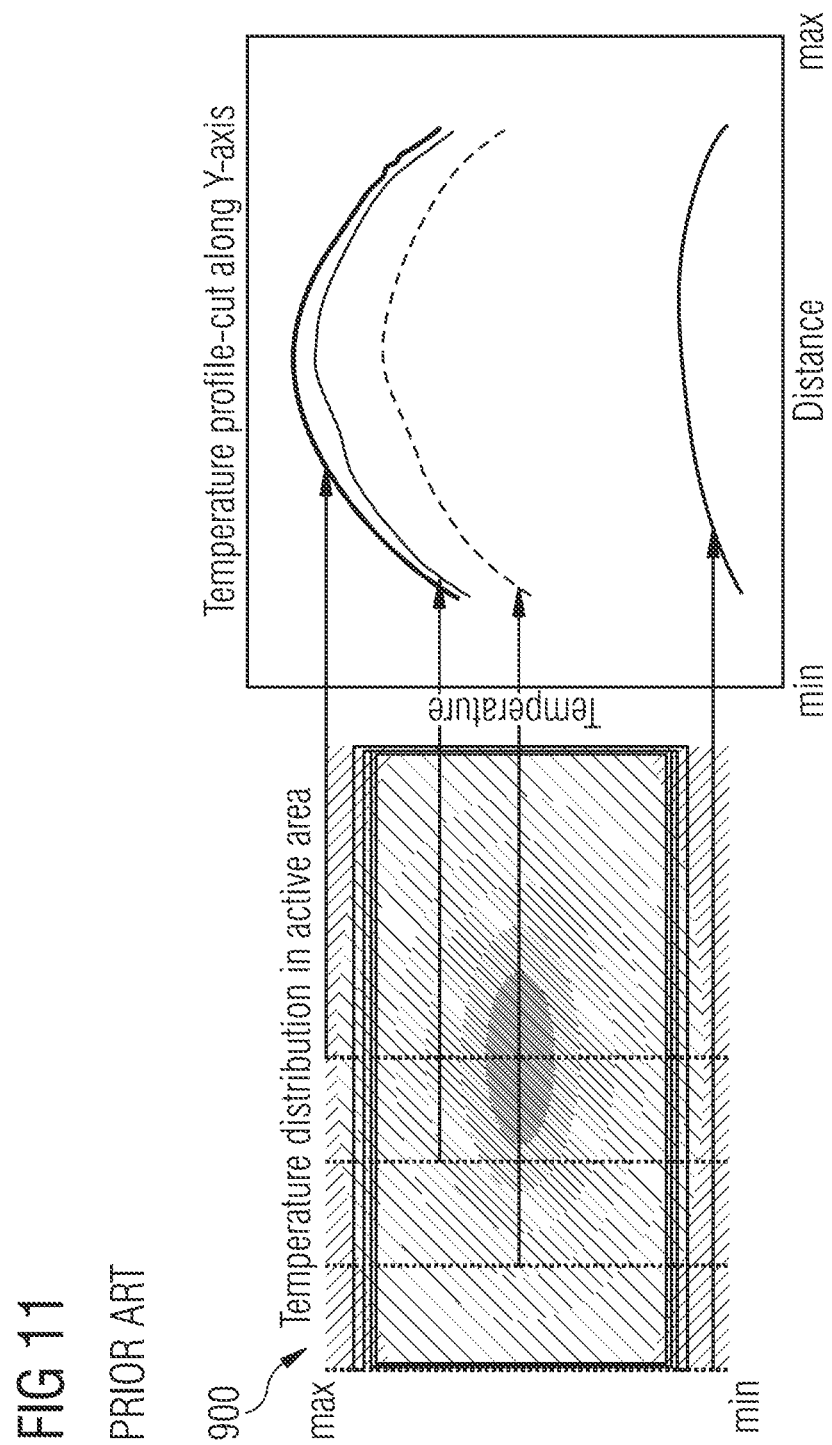
FIG. 11 illustrates a graph of temperature distribution and a graph of temperature profiles along four Y-axis in the active area of the conventional power switching device depicted in FIG. 9.
Figure 12:
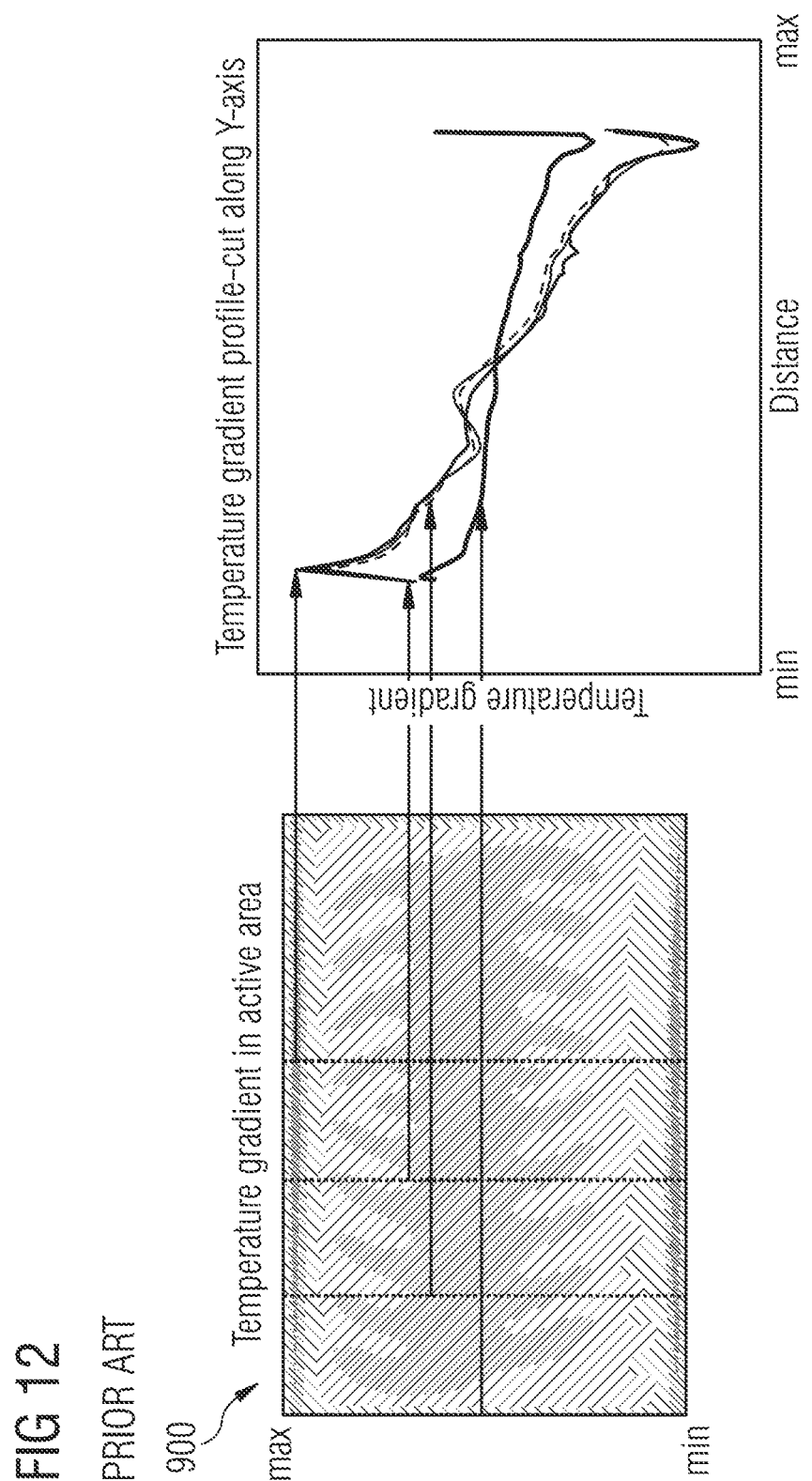
FIG. 12 illustrates a graph of temperature gradients magnitude distribution and a graph of temperature gradients profiles along the four Y-axis depicted in FIG. 11.
Figure 13:
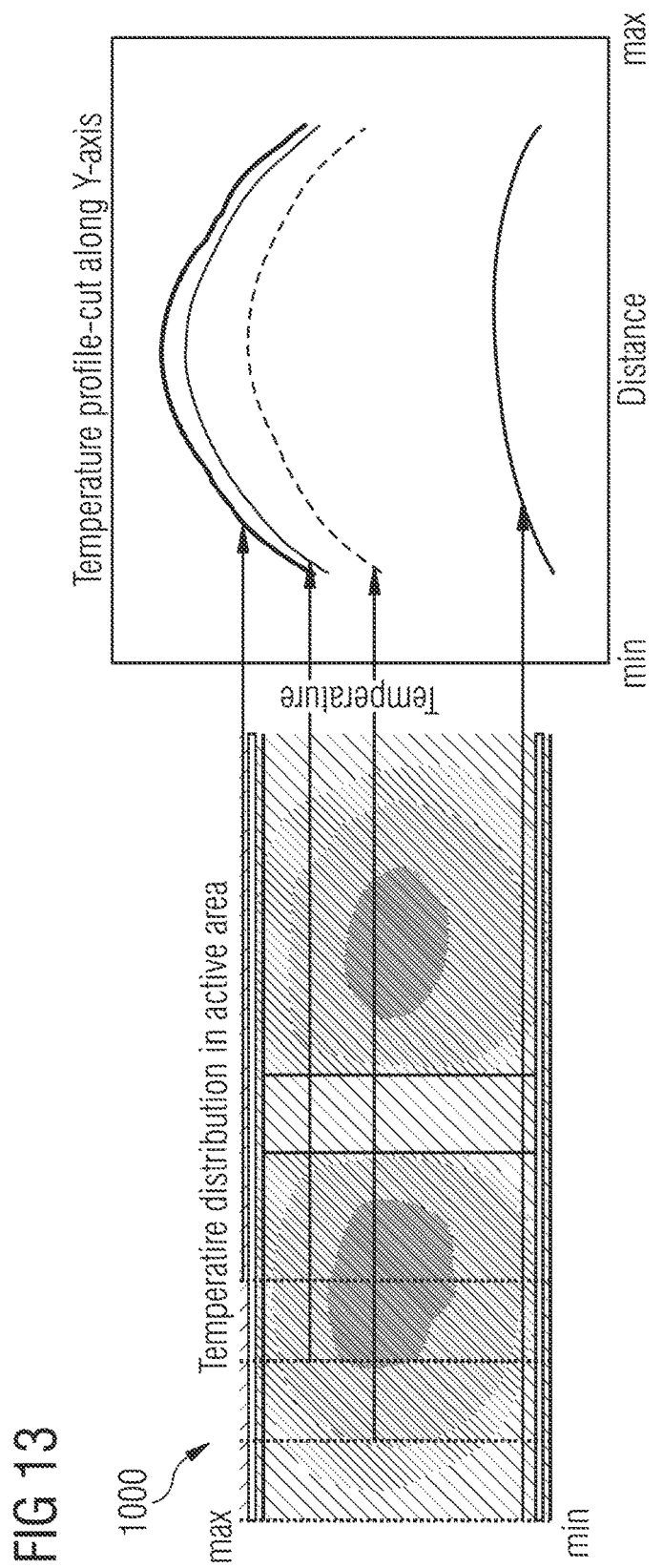
FIG. 13 illustrates a graph of temperature distribution and a graph of temperature profiles along four Y-axis in the active area of the embodiment power switching device depicted in FIG. 10.
Figure 14:
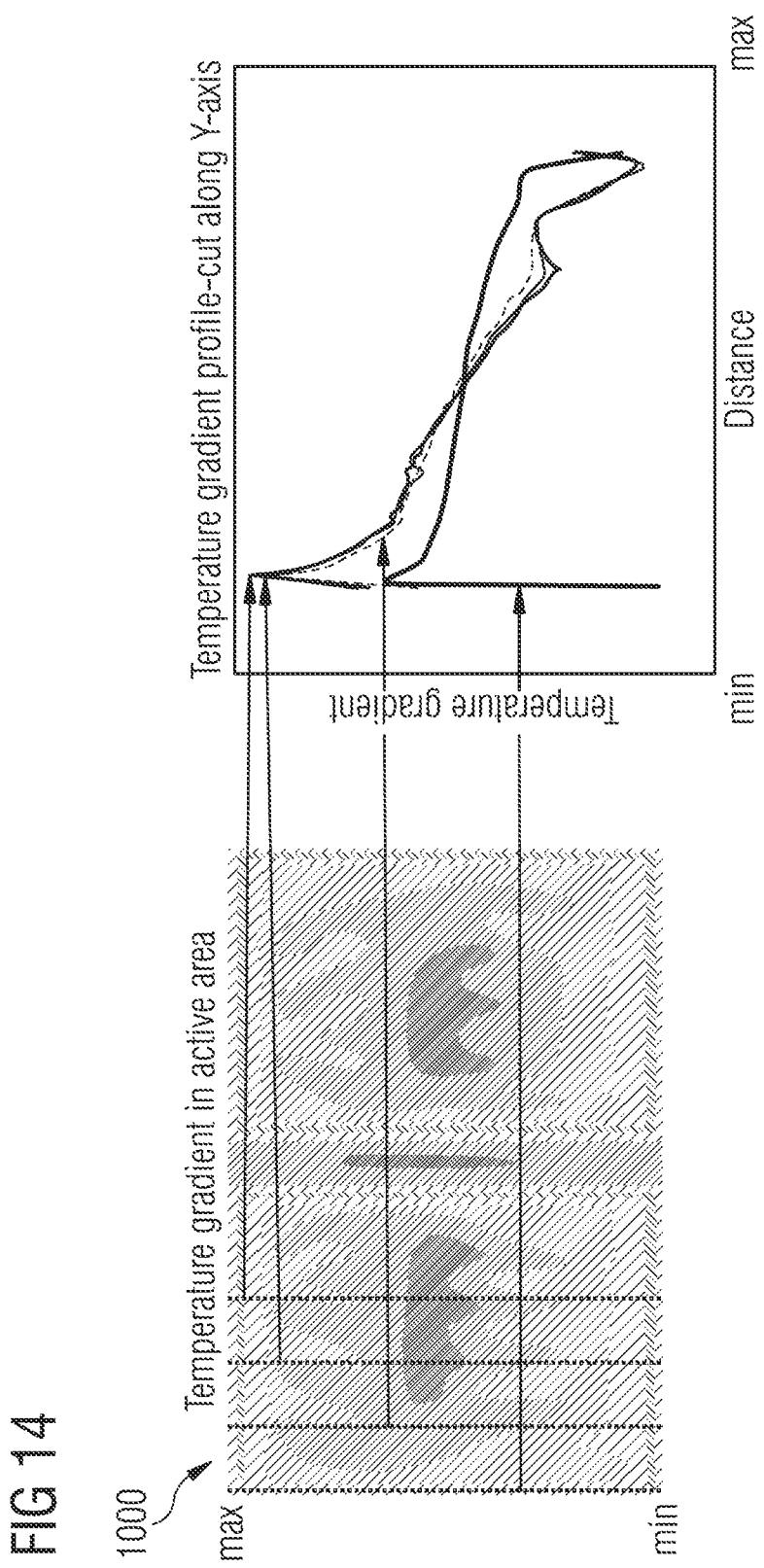
FIG. 14 illustrates a graph of temperature gradients magnitude distribution and a graph of temperature gradients profiles along the four Y-axis depicted in FIG. 13.

FIG. 11 illustrates temperature profiles along four Y-axis in the active area 900 of the conventional power switching device, and FIG. 12 illustrates temperature gradients along those four Y-axis. FIG. 13 illustrates temperature distributions along four Y-axis profiles in the active area 1000 of the embodiment power switching device, while FIG. 14 illustrates temperature gradients along those four Y-axis profiles. As shown, the active area 1000 of the embodiment power switching device achieves different temperature gradients than the active area 900 of the conventional power switching device, which is beneficial from the reliability point of view.

Figure 15:
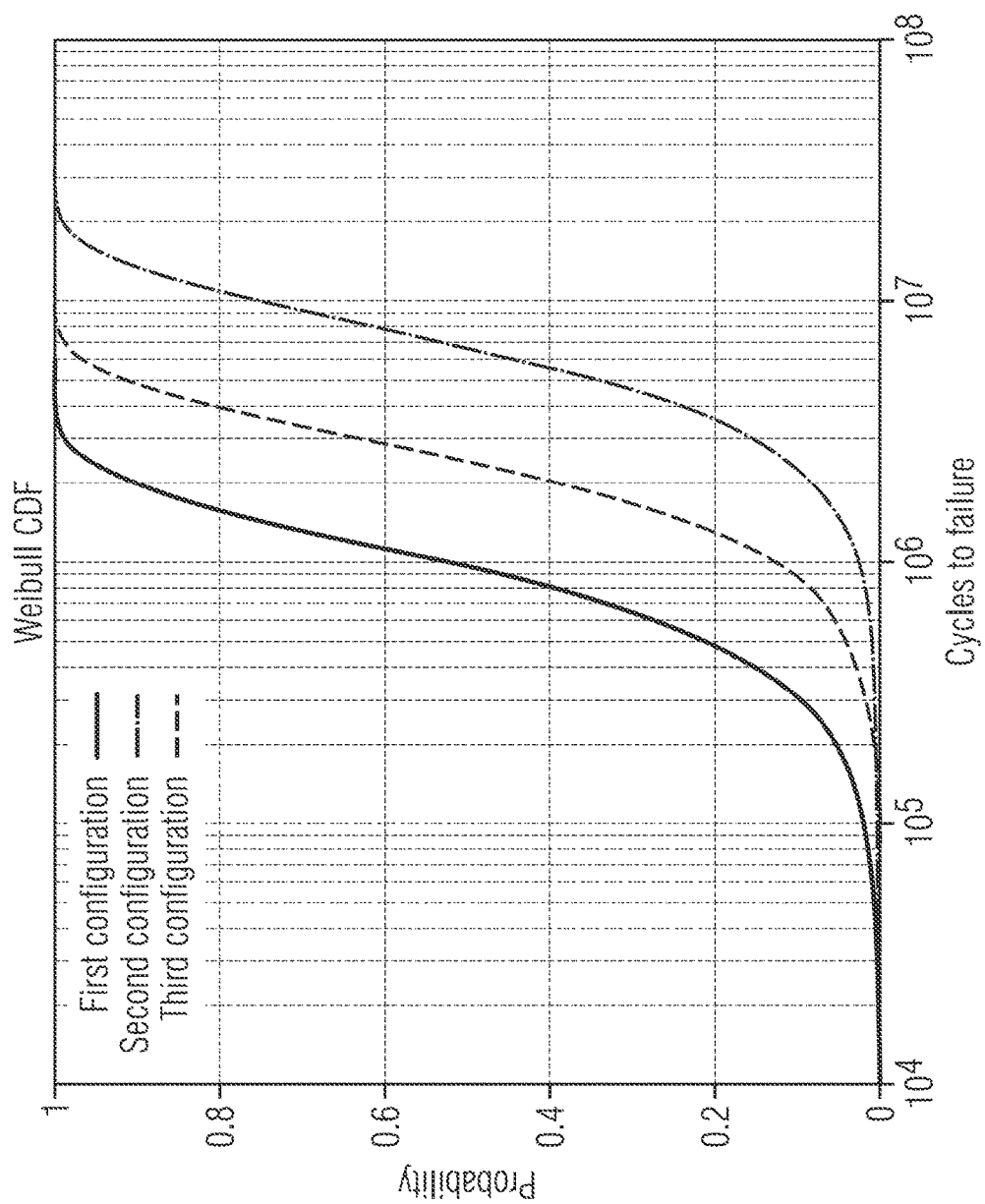
FIG. 15 illustrates a graph comparing probabilities of failure for power devices having different configurations.

This modification in temperature gradients increases the average lifetime of the embodiment power switching device. FIG. 15 illustrates a graph comparing probabilities of failure of power devices having three different configurations. First configuration: a conventional power device which has all transistor subsets turned on during high stress periods. Second configuration: a power device which has a transistor subset deactivated for all high stress periods. Third configuration: a power device that alternates between having a subset of transistors deactivated and having all transistors activated during high stress periods. As shown, both of the embodiment power devices have longer lifetimes than the conventional power device. As shown, both of the embodiment power devices have lower probabilities of failure than the conventional power devices after a comparable number of stress cycles. Note that devices from third configuration do not have lifetimes two times larger than devices from the first configuration, as was expected. Actually, these devices survive longer because stress relaxation occurs due to direction changes of temperature gradients during the period when the device operates with one subset deactivated.

High local temperatures and non-uniform temperature distribution (thermal gradients) induce mechanical stress in transistor metallization. Embodiment techniques provided herein control the temperature gradients and peak temperature by modulating the power distribution in the device. Modulating the power distribution does not reduce the total power dissipated by the device. The average temperature on the surface of the device (e.g., the temperature integrated over the surface) is higher in the conventional case of FIG. 9 than in the embodiment device of FIG. 10 and the peak temperatures are approximately the same for the devices tested, therefore the temperature gradients differ between devices. Drain current modulation may be used to modulate the power device for power distribution control. Drain current modulation may be adjusted from the gate and bulk terminals of each cell/group of cells. Drain-source voltage distribution can also be adjusted from source, drain potentials.

In some embodiments, power distribution is adjusted over the lifetime of the power device according to data measured by thermo-mechanical stress sensors embedded in the power device. In other embodiments, power distribution is adjusted over the lifetime of the power device according to a predefined pattern, which may be a pattern that is derived from simulations and/or testing. An appropriate detection-biasing scheme can be used to control mechanical stress increment per power cycle, as well as to control the rate of accumulation of the peak mechanical stress. To better illustrate this consider that a transistor undergoes thermo-mechanical stress as result of high temperature/power cycling. During its lifetime, peak mechanical stress builds somewhere in the metallization in a region. From sensor or simulation data, a subset of cells of power device components is adjusted in a manner that shifts the peak stress away from that region after a period of time, such that the peak mechanical stress is exerted on a different region. The process repeats and the stress is distributed uniformly in the metallization.

Embodiments of this disclosure reduce/mitigate thermal-induced stress without significantly increasing the size of the active area and/or chip area. Embodiments of this disclosure achieve a variation in the temperature distribution in the power device over the course of its lifetime by deactivating different subsets of transistors during different periods. This may extend the lifetime of the power device by achieving a more uniform mechanical stress distribution. Temperature distribution control is achieved by power distribution modulation. The power distribution is, in turn, controlled by conveniently biasing groups of cells (subsets) within the transistor. By applying a corresponding bias to the terminals of each cell or group of cells, the current-density and/or drain-source voltage can be locally adjusted in real-time to achieve a power density distribution that leads to more evenly distributed mechanical stress in the metallization of the power device. Thermo-mechanical stress sensors can be used to obtain information on the mechanical stress evolving in the metallization.

Embodiments of this disclosure can be applied to any type of power device, including power devices incorporating double-diffused metal-oxide-semiconductor (DMOS) transistors, bipolar junction transistors (BJT), insulated-gate bipolar transistors (IGBTs). Indeed, embodiments of this disclosure can be applied to any device acting as a heating element or heat source, as it enhances the lifetime of its metallization system.

Over its lifetime, a transistor is subject to multiple high power pulse events which cause heating of the device and high local temperature transients. In addition, the non-uniform heating of the device generates high temperature gradients. High temperatures and high temperature gradients are present both in the power device (Silicon surface) and in its metallization system (metal films and dielectric which separates the metals). These two conditions cause different expansions in the Silicon, metal, and dielectric, which generates mechanical stresses at the corresponding junctions. The stress accumulates with each high power pulse event until the system ultimately fails.

Practically speaking, most high power pulses are generated when the switch operates with an inductive load or when the switch operates with a capacitive load. When the switch operates with an inductive load, at turn-off, a high power pulse is dissipated in the device (inductive clamping event). On the other hand, when the switch operates with a capacitive load, at turn-on, a high power pulse is dissipated in the device. Embodiments of this disclosure provide techniques for reducing the resulting thermo-mechanical stress during those switching events.

Figure 16:
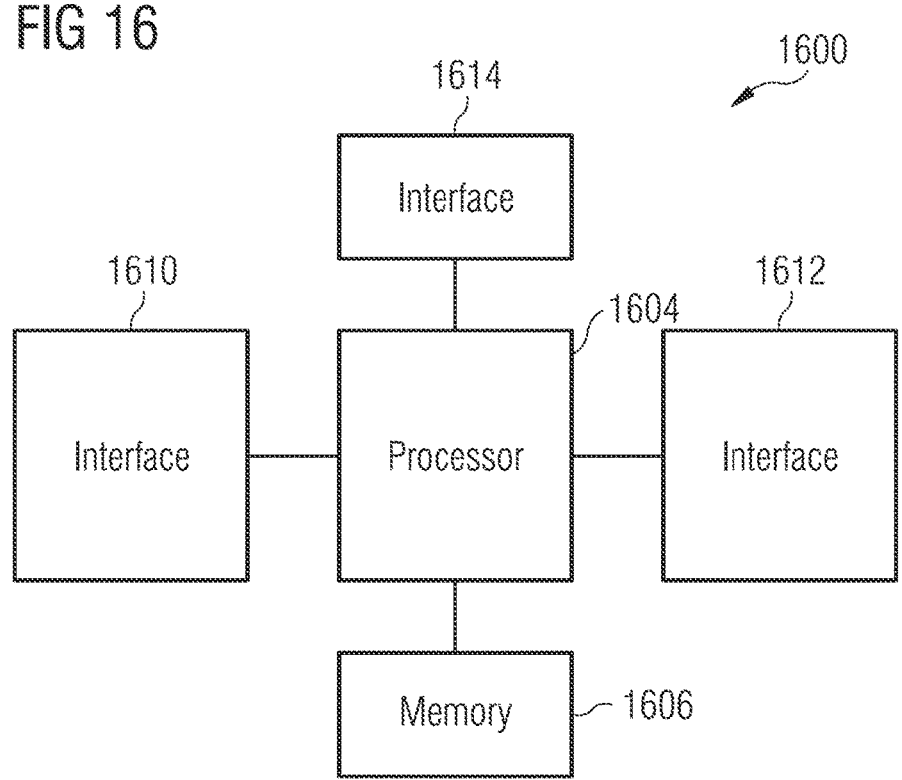
FIG. 16 illustrates a diagram of an embodiment processing system.

FIG. 16 illustrates a block diagram of a processing system 1600 that may be used for implementing the devices and methods disclosed herein. The processing system 1600 may include a processor 1604, a memory 1606, and a plurality of interfaces 1610-1614, which may (or may not) be arranged as shown in FIG. 16. The processor 1604 may be any component capable of performing computations and/or other processing related tasks, and the memory 1606 may be any component capable of storing programming and/or instructions for the processor 1604. The interfaces 1610-1614 may be any component or collection of components that allows the processing system 1600 to communicate with other systems and/or devices. The interfaces 1610-1614 may include serial interfaces (e.g., a Serial Peripheral Interface (SPI), Universal Serial Bus (USB), etc.), parallel interfaces, or combinations thereof.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A method comprising:
    sensing when an active region in an active area of a power switching device is experiencing at least a threshold amount of thermo-mechanical stress, wherein the power switching device comprises an input port, an output port, and a set of power device components coupled between the input port and the output port, wherein the active region of the power switching device includes activated power device components in the set of power device components, and wherein electrical current flows from the input port over the active region to the output port when the power switching device is in a conducting stage; and
    activating a first subset of the power device components without activating a second subset of the power device components to dynamically bifurcate a shape of the active region into a plurality of active sub-regions in response to sensing that the active region in the active area of the power switching device is experiencing at least the threshold amount of thermo-mechanical stress, wherein the electrical current flows through the first subset of the power device components without flowing through the second subset of the power device components when the power switching device is in the conducting stage, wherein dynamically bifurcating the shape of the active region reduces a temperature gradient of the active region.

2. The method of claim 1, wherein activating the first subset of the power device components without activating the second subset of the power device components changes the temperature gradient across the active area of the power switching device.

3. The method of claim 1, wherein the power device components comprise transistors, the first subset of the power device components corresponding to a first subset of the transistors, and the second subset of the power device components corresponding to a second subset of the transistors, and
    wherein the power switching device further comprises a first subset of connections adapted to carry activation signals to gates of the first subset of the transistors, and a second subset of connections adapted to carry activation signals to gates of the second subset of the transistors.

4. The method of claim 3, wherein the second subset of connections are opened, while the first subset of connections are closed, and wherein the second subset of connections being opened prevents the activation signals from reaching the gates of the second subset of the transistors when the power switching device is in the conducting stage.

5. The method of claim 4, wherein the power switching device further comprises a third subset of connections adapted to carry triggering signals from a gate driver to the gates of the transistors when the power switching device is actuated by the gate driver, and
wherein the third subset of connections is independent from the second subset of connections such that the triggering signals are provided to the gates of the second subset of the transistors during actuation of the power switching device irrespective of the second subset of connections being opened.

6. The method of claim 5, wherein the second subset of connections are permanently opened during a manufacturing process of the power switching device.

7. The method of claim 1, wherein sensing when the active region in the active area of the power switching device is experiencing at least the threshold amount of thermo-mechanical stress comprises using an array of thermo-mechanical stress sensors disposed in the active area.

8. The method of claim 7, wherein the array of thermo-mechanical stress sensors comprises a metal line stress array sensor.

9. The method of claim 7, wherein the array of thermo-mechanical stress sensors comprises a plurality of temperature sensors disposed within the active area.

10. The method of claim 1, wherein sensing comprises using a temperature sensor.

11. The method of claim 1, wherein sensing comprises using a mechanical stress sensor.

12. A method comprising:
sensing when an active area in an active region of a power switching device experiences at least a threshold amount of thermo-mechanical stress, wherein the power switching device comprises an input port, an output port, and power device components coupled between the input port and the output port, and wherein electrical current flows between the input port and the output port when the power switching device is in a conducting stage; and
dynamically deactivating different subsets of the power device components during different periods to dynamically bifurcate a shape of the active region of the power switching device into a plurality of active sub-regions, wherein at least one of the power device components remains activated during each of the different periods, and bifurcating the shape of the active region reduces a temperature gradient of the active region, and
wherein the electrical current flows through activated power device components without flowing through the different subsets of the power device components that are deactivated during a given period when the power switching device is in the conducting stage.

13. The method of claim 12, wherein dynamically deactivating the different subsets of the power device components during the different periods comprises:
selectively deactivating the different subsets of the power device components in accordance with a random selection criteria.

14. The method of claim 12, wherein dynamically deactivating the different subsets of the power device components during the different periods comprises:
selectively deactivating the different subsets of the power device components in accordance with a predefined pattern.

15. The method of claim 12, wherein dynamically deactivating the different subsets of the power device components during the different periods comprises:
selectively deactivating the different subsets of the power device components in accordance with readings from stress sensors configured to measure a thermo-mechanical stress of the active area.

16. The method of claim 15, wherein the stress sensors are temperature sensors.

17. The method of claim 15, wherein the stress sensors are mechanical stress sensors.

18. The method of claim 15, wherein the power device components comprise transistors,
wherein the power switching device further comprises a first subset of connections adapted to carry activation signals to gates of a first subset of the transistors, and a second subset of connections adapted to carry activation signals to gates of a second subset of the transistors, and
wherein dynamically deactivating the different subsets of the power device components during the different periods comprises:
opening the first subset of connections during a first period, wherein opening the first subset of connections prevents the activation signals from activating the first subset of the transistors during the first period; and
opening the second subset of connections during a second period, wherein opening the second subset of connections prevents the activation signals from activating the second subset of the transistors during the second period.

19. The method of claim 18, further comprising:
sending triggering signals over a third subset of connections during the first period, the third subset of connections extending from a gate driver to gates of the transistors, wherein the third subset of connections are independent from the first subset of connections such that the triggering signals activate the first subset of the transistors when the power switching device is actuated during the first period irrespective of the second subset of connections being opened.

20. A power switching device comprising:
an input port adapted to be coupled to a load;
an output port adapted to be coupled to a sink, wherein electrical current flows between the input port and the output port when the power switching device is in a conducting stage;
a thermo-mechanical stress sensor configured to measure a thermo-mechanical stress of an active region of the power switching device; and
a plurality of power device components coupled between the input port and the output port, wherein a first subset of the power device components are de-activated when the thermo-mechanical stress sensor indicates that the active region of the power switching device experiences at least a threshold amount of thermo-mechanical stress during a first period to dynamically bifurcate a shape of the active region of the power switching device into a plurality of active sub-regions, wherein dynamically bifurcating the shape of the active region reduces a temperature gradient of the active region, and a second subset of the power device components remain activated when the thermo-mechanical stress sensor indicates that the active region of the power switching device experiences at least the threshold amount of thermo-mechanical stress during the first period, and wherein the electrical current flows through the second subset of the power device components without flowing through the first subset of the power device components when the thermo-mechanical stress sensor indicates that the active region of the power switching device experiences at least the threshold amount of thermo-mechanical stress during the first period.

21. The power switching device of claim 20, wherein the power device components comprise transistors having drain-source paths coupled between the input port and the output port, the first subset of the power device components corresponding to a first subset of the transistors, and the second subset of the power device components corresponding to a second subset of the transistors.

22. The power switching device of claim 21, further comprising:
- a first subset of connections configured to carry first activation signals to gates of the first subset of the transistors;
- a second subset of connections configured to carry second activation signals to gates of the second subset of the transistors; and
- a controller configured to open the first subset of connections during the first period without opening the second subset of connections when the active region of the power switching device experiences at least the threshold amount of thermo-mechanical stress during the first period.

23. The power switching device of claim 22, further comprising:
- a gate driver adapted to provide triggering signals when the power switching device is actuated; and
- a third subset of connections configured to carry the triggering signals to gates of the transistors when the power switching device is actuated,
- wherein the third subset of connections are independent from the first subset of connections such that the triggering signals activate the first subset of the transistors when the power switching device is actuated during the first period irrespective of the first subset of connections being open.

24. The power switching device of claim 21, wherein the power switching device further comprises:
- connections adapted to carry activation signals to gates of the transistors; and
- a control circuit configured to dynamically open different subsets of the connections during different periods to prevent the activation signals from activating a corresponding subset of the transistors when the active region of the power switching device experiences at least the threshold amount of thermo-mechanical stress during a corresponding period.

25. The power switching device of claim 24, wherein the control circuit is adapted to selectively deactivate the different subsets of the transistors during the different periods in accordance with a random selection criteria.

26. The power switching device of claim 24, wherein the control circuit is adapted to selectively deactivate the different subsets of the transistors during the different periods in accordance with a predefined pattern.

27. The power switching device of claim 24, wherein the control circuit is adapted to selectively deactivate the different subsets of the transistors during the different periods in accordance with readings from the thermo-mechanical stress sensor.

28. The power switching device of claim 27, wherein the thermo-mechanical stress sensor comprises temperature sensors.

29. The power switching device of claim 28, wherein the temperature sensors comprise a plurality of temperature sensors disposed in the active region.

30. The power switching device of claim 27, wherein the thermo-mechanical stress sensor comprises mechanical stress sensors.

31. The power switching device of claim 30, wherein the mechanical stress sensors comprise a metal line stress array sensor.

32. The power switching device of claim 21, wherein the input port is adapted to be coupled to an inductive load, and wherein the power switching device further comprises:
- a chain of diodes, including at least a Zener diode, coupled between the input port and gates of the transistors, the chain of diodes adapted to enter an avalanche mode when a voltage across at least one of the power device components exceeds a threshold; and
- connections extending between the chain of diodes and the gates of the transistors, the connections configured to carry activation signals to the gates of the transistors when the chain of diodes enter the avalanche mode,
- wherein a first subset of the connections extend between the chain of diodes and the gates of the second subset of the transistors, the first subset of the connections being open during the first period, and
- wherein a second subset of the connections extend between the chain of diodes and the gates of the second subset of the transistors, the second subset of the connections being closed during the first period.

33. The power switching device of claim 32, wherein the second subset of the connections are permanently open.

34. The power switching device of claim 32, wherein at least some connections in the first subset of the connections are closed during a second period.

35. The power switching device of claim 21, wherein the input port is adapted to be coupled to a capacitive load, and wherein the power switching device further comprises:
- a gate driver configured to actuate the power switching device by providing a triggering signal to gates of the transistors;
- a first subset of connections extending between the gate driver and the gates of the first subset of the transistors, the first subset of connections being open during the first period; and
- a second subset of connections extending between the gate driver and the gates of the second subset of the transistors, the second subset of connections being closed during the first period.

36. The power switching device of claim 35, wherein the second subset of connections are permanently open.

37. The power switching device of claim 35, wherein at least some connections in the first subset of connections are closed during a second period.

* * * * *